(12) United States Patent
Lee et al.

(10) Patent No.: US 11,009,526 B2
(45) Date of Patent: *May 18, 2021

(54) PROBE CARD DEVICE AND THREE-DIMENSIONAL SIGNAL TRANSFER STRUCTURE THEREOF

(71) Applicant: CHUNGHWA PRECISION TEST TECH. CO., LTD., Taoyuan (TW)

(72) Inventors: Wen-Tsung Lee, New Taipei (TW); Kai-Chieh Hsieh, Taoyuan (TW); Wei-Jhih Su, Taichung (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 223 days.

This patent is subject to a terminal disclaimer.

(21) Appl. No.: 16/382,301

(22) Filed: Apr. 12, 2019

(65) Prior Publication Data

US 2019/0377004 A1 Dec. 12, 2019

(30) Foreign Application Priority Data

Jun. 6, 2018 (TW) ................................. 107119477

(51) Int. Cl.
*G01R 31/00* (2006.01)
*G01R 1/073* (2006.01)
*G01R 1/067* (2006.01)

(52) U.S. Cl.
CPC ..... *G01R 1/07342* (2013.01); *G01R 1/06716* (2013.01); *G01R 1/07364* (2013.01)

(58) Field of Classification Search
CPC ............ G01R 1/06705; G01R 1/06716; G01R 1/07342; G01R 1/07364; G01R 1/07371; G01R 1/07357; G01R 31/2886; G01R 31/2889

See application file for complete search history.

(56) References Cited

U.S. PATENT DOCUMENTS

| | | | | |
|---|---|---|---|---|
| 6,208,158 | B1 * | 3/2001 | Schein | G01R 1/07328 324/755.05 |
| 10,845,385 | B2 * | 11/2020 | Lee | G01R 1/06716 |
| 2008/0315901 | A1 * | 12/2008 | Inoue | G01R 1/07342 324/756.03 |
| 2012/0187972 | A1 * | 7/2012 | Lee | G01R 31/2889 324/756.03 |

(Continued)

*Primary Examiner* — Minh N Tang
(74) *Attorney, Agent, or Firm* — Li & Cai Intellectual Property (USA) Office

(57) ABSTRACT

A three-dimensional (3D) signal transfer structure of a probe card device includes a transfer plate, a supporting frame, and a guiding plate. The transfer plate has a first surface and a second surface that is opposite to the first surface. The transfer plate includes a plurality of signal circuits each having a signal contact arranged on the first surface. The supporting frame is abutted against and fixed onto the first surface of the transfer plate. A portion of the first surface abutted against the supporting frame is arranged outside the signal contacts. The guiding plate has a plurality of thru-holes and is disposed on the supporting frame. The guiding plate, the supporting frame, and the transfer plate jointly and surroundingly define a receiving space, and the signal contacts of the transfer plate are arranged in the receiving space.

8 Claims, 7 Drawing Sheets

(56) References Cited

U.S. PATENT DOCUMENTS

2014/0118016 A1* 5/2014 Breinlinger ........ G01R 1/07357
  324/750.25
2015/0280345 A1* 10/2015 Kimura .............. H01R 13/2428
  439/700

* cited by examiner

PROBE CARD DEVICE AND THREE-DIMENSIONAL SIGNAL TRANSFER STRUCTURE THEREOF

CROSS-REFERENCE TO RELATED PATENT APPLICATION

This application claims the benefit of priority to Taiwan Patent Application No. 107119477, filed on Jun. 6, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe card, and more particularly to a probe card device and a three-dimensional signal transfer structure thereof.

BACKGROUND OF THE DISCLOSURE

A conventional probe card includes a probe retainer, a plurality of probes passing through and positioned with the probe retainer, and a transfer plate spaced apart from the probe retainer and connected to the probes. The probe retainer of the conventional probe card includes an upper die, a lower die, and a spacer that is sandwiched between the upper die and the lower die. Two opposite ends of each of the probes respectively protrude from the upper die and the lower die of the probe retainer, so that one of the two opposite ends of each of the probes is connected to the transfer plate, and the other end of each of the probes is configured to detect an object (e.g., a semi-conductor wafer).

However, the above configuration of the conventional probe card has been in existence for many years, and research on the probe card by those skilled in the art has not been able to break away from the conventional configuration, so that the development of the conventional probe card has been limited from achieving significant progress.

SUMMARY OF THE DISCLOSURE

In response to the above-referenced technical inadequacies, the present disclosure provides a probe card device and a three-dimensional signal transfer structure thereof to effectively improve the issues associated with conventional probe cards.

In one aspect, the present disclosure provides a probe card device, which includes a three-dimensional (3D) signal transfer structure and a plurality of conductive probes. The 3D signal transfer structure includes a transfer plate, a supporting frame, and a guiding plate. The transfer plate has a first surface and a second surface that is opposite to the first surface. The transfer plate includes a plurality of signal circuits each having a signal contact arranged on the first surface. The supporting frame is abutted against and fixed onto the first surface of the transfer plate. A portion of the first surface abutted against the supporting frame is arranged outside the signal contacts. The guiding plate has a plurality of thru-holes and is disposed on the supporting frame. The guiding plate, the supporting frame, and the transfer plate jointly and surroundingly define a receiving space, and the signal contacts of the transfer plate are arranged in the receiving space. The conductive probes each have an elastic segment, a detecting segment, and a connecting segment, the latter two of which are respectively arranged at two opposite sides of the elastic segment. The conductive probes respectively pass though the thru-holes of the guiding plate, the elastic segment and the connecting segment of each of the conductive probes are arranged in the receiving space, and the detecting segment of each of the conductive probes is exposed out of the receiving space. The connecting segments of the conductive probes are respectively fixed on the signal contacts of the transfer plate.

In one aspect, the present disclosure provides a three-dimensional (3D) signal transfer structure of a probe card device. The 3D signal transfer structure includes a transfer plate, a supporting frame, and a guiding plate. The transfer plate has a first surface and a second surface that is opposite to the first surface. The transfer plate includes a plurality of signal circuits each having a signal contact arranged on the first surface. The supporting frame is abutted against and fixed onto the first surface of the transfer plate. A portion of the first surface abutted against the supporting frame is arranged outside the signal contacts. The guiding plate has a plurality of thru-holes and is disposed on the supporting frame. The guiding plate, the supporting frame, and the transfer plate jointly and surroundingly define a receiving space, and the signal contacts of the transfer plate are arranged in the receiving space.

Therefore, the 3D signal transfer structure of the probe card device in the present disclosure having just one guiding plate is different from conventional probe cards, thereby effectively reducing cost of the probe card device (e.g., the structure and the assembling process of the probe card device can be simplified) and providing a new development direction. Moreover, the 3D signal transfer structure of the probe card device can be cooperated with shorter conductive probes, so that the probe card device can be used to transmit signal of higher frequency.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

Figure 1:
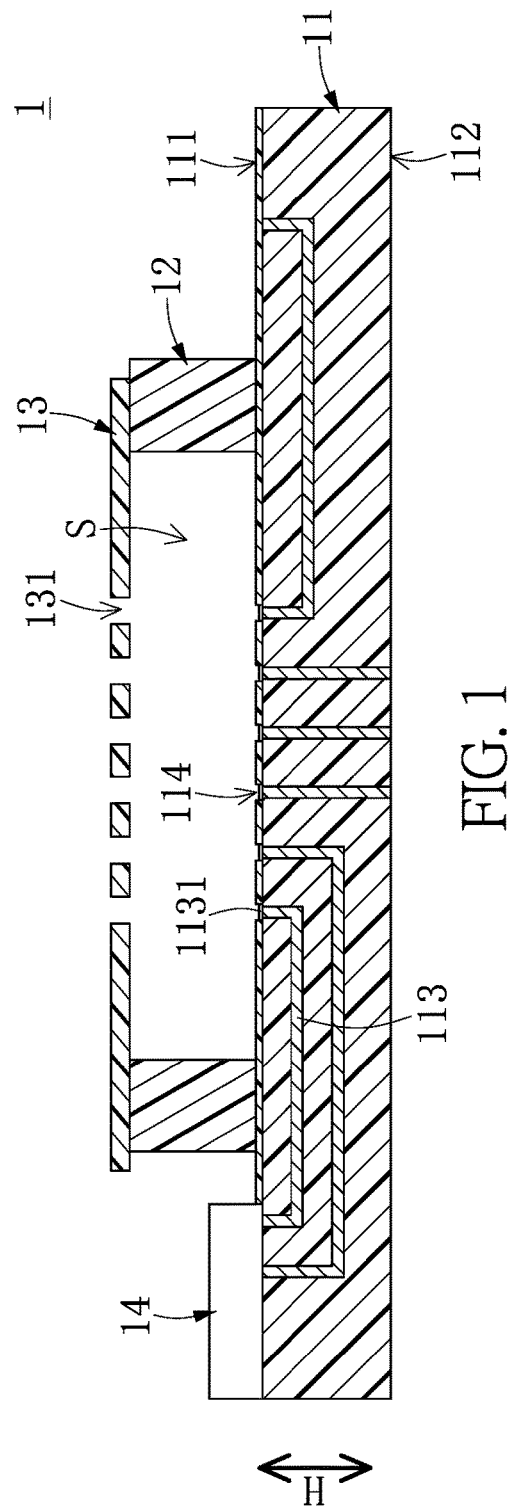
FIG. 1 is a schematic view of a three-dimensional signal transfer structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 6, a first embodiment of the present disclosure provides a probe card device 100 used for detecting an object 200 (e.g., a semi-conductor wafer). The probe card device 100 includes a three-dimensional (3D) signal transfer structure 1 and a plurality of conductive probes 2 inserted into the 3D signal transfer structure 1. The 3D signal transfer structure 1 in the present embodiment is cooperated with the conductive probes 2, but the present disclosure is not limited thereto. For example, in other embodiments of the present disclosure, the 3D signal transfer structure 1 can be independently sold.

As shown in FIG. 1, the 3D signal transfer structure 1 includes a transfer plate 11, a supporting frame 12 disposed on the transfer plate 11, and a guiding plate 13 disposed on the supporting frame 12. The 3D signal transfer structure 1 is formed as a one-piece configuration by directly fixing the supporting frame 12 onto the transfer plate 11 and directly fixing the guiding plate 13 onto the supporting frame 12, so that the guiding plate 13, the supporting frame 12, and the transfer plate 11 jointly and surroundingly define a receiving space S. In other words, a configuration formed by indirectly fixing the supporting frame 12 to the transfer plate 11 does not suitable to be regarded as the 3D signal transfer structure 1 of the present embodiment. The following description discloses the structure and connection relationships of each component of the 3D signal transfer structure 1.

Figure 2:
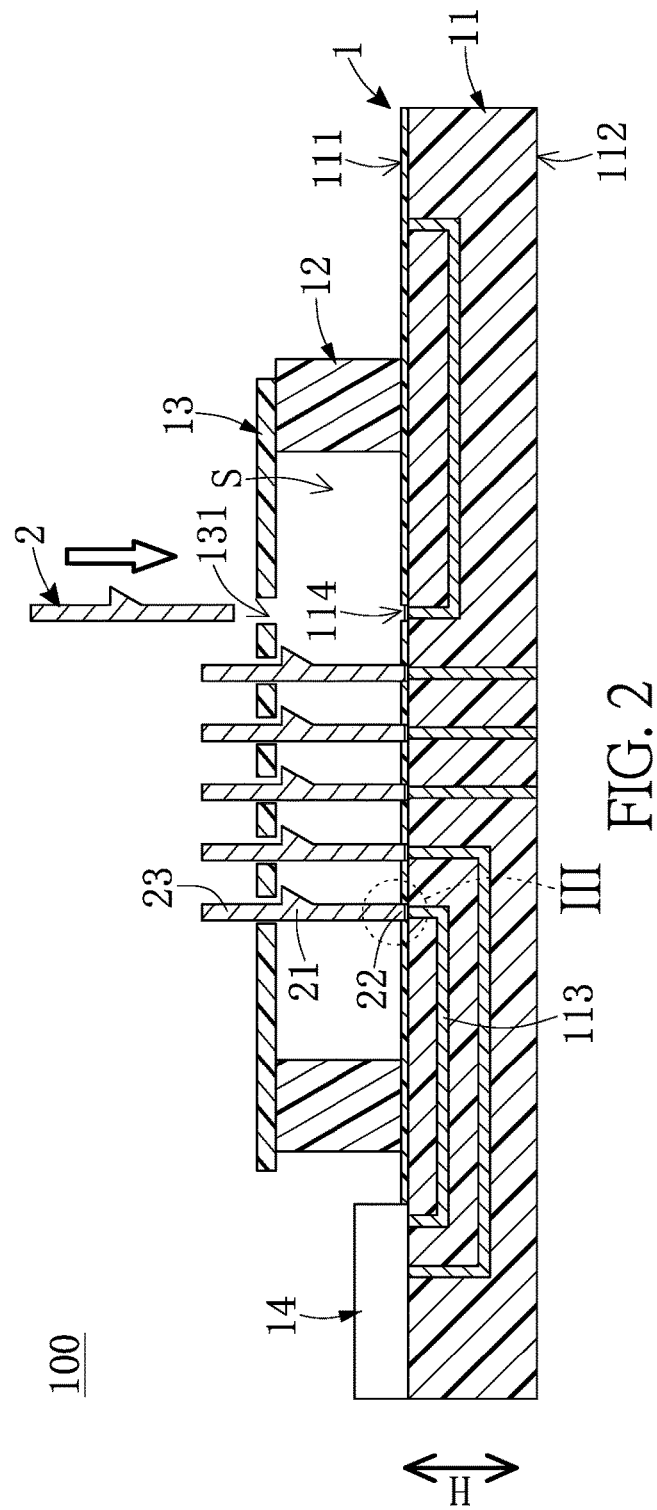
FIG. 2 is a schematic view showing the three-dimensional signal transfer structure of FIG. 1 when being implanted with probes.
Figure 6:
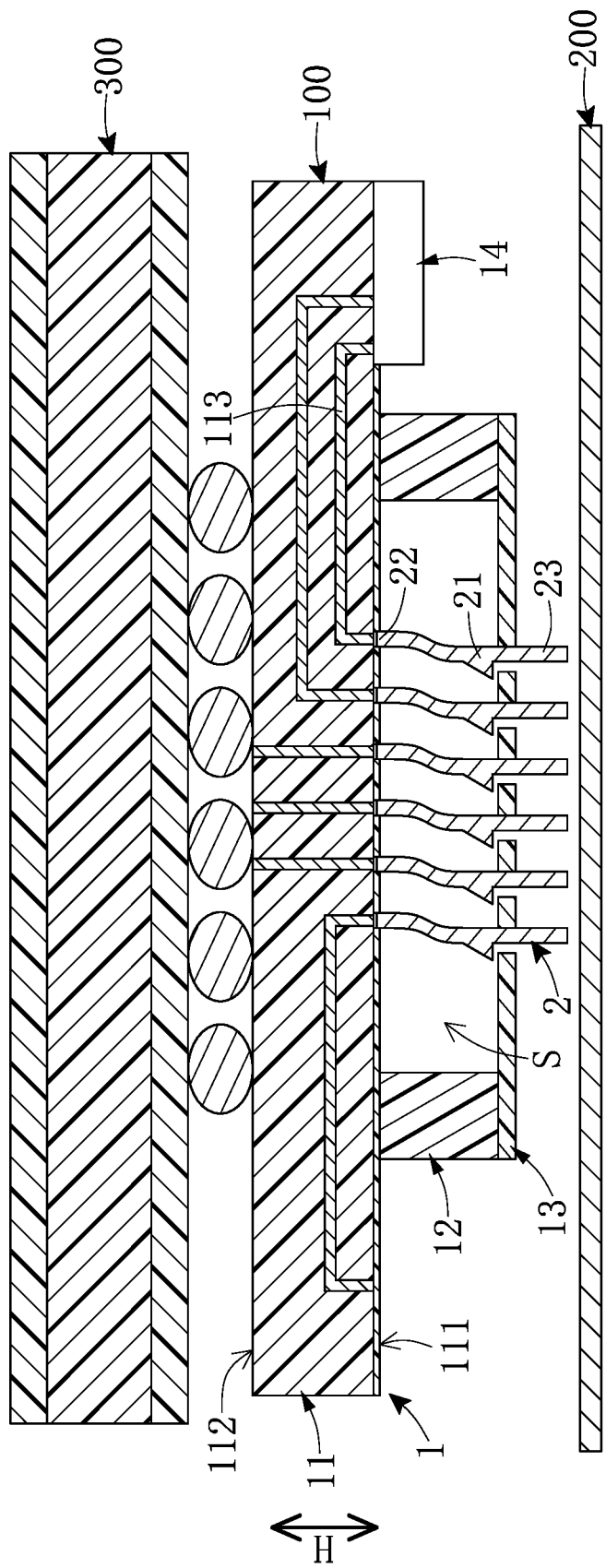
FIG. 6 is a schematic view showing the probe card device of FIG. 5 that is fixed on a circuit board for detecting an object.

As shown in FIG. 1 and FIG. 2, the transfer plate 11 of the present embodiment is a substantially flat structure, and has a first surface 111 and a second surface 112 that is opposite to the first surface 111. The transfer plate 11 includes a plurality of signal circuits 113 each having a signal contact 1131 arranged on the first surface 111, and the signal contacts 1131 of the transfer plate 11 are arranged in the receiving space S. Moreover, the second surface 112 of the transfer plate 11 is used for being fastened to a circuit board 300 (as shown in FIG. 6).

Figure 4:
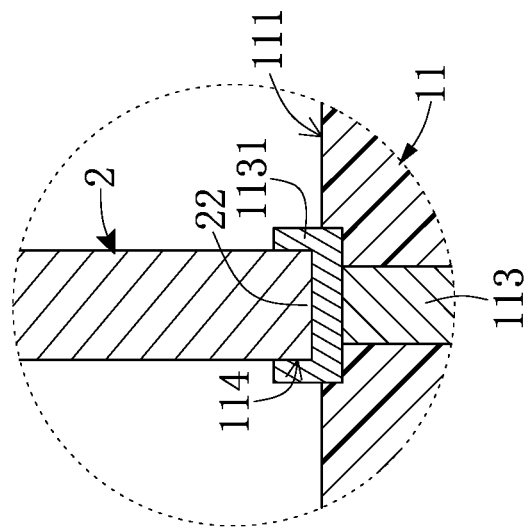
FIG. 4 is an enlarged view showing the portion IR of FIG. 2 in another configuration.
Figure 3:
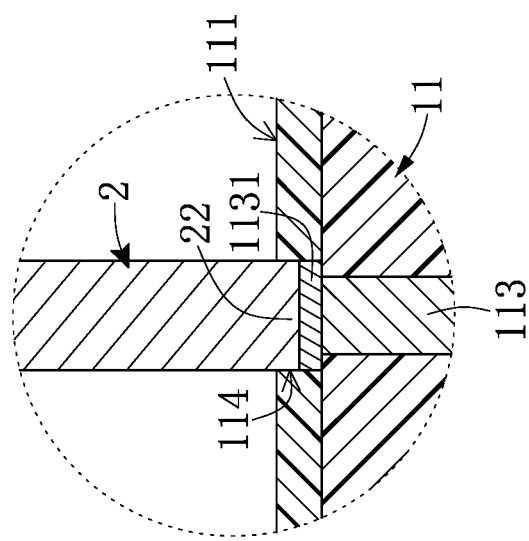
FIG. 3 is an enlarged view showing a portion IR of FIG. 2.

Specifically, as shown in FIG. 2 to FIG. 4, the transfer plate 11 has a plurality of recesses 114 respectively arranged on the signal contacts 1131 in the receiving space S. The recess 114 in the present embodiment can be formed by the signal contact 1131 and an adjacent portion of the transfer plate 11 (as shown in FIG. 3), or can be formed just by the signal contact 1131 (as shown in FIG. 4), but the present disclosure is not limited thereto.

In addition, the transfer plate 11 includes an impedance matching circuit 14 arranged outside the receiving space S, and the impedance matching circuit 14 is electrically coupled to at least part of the signal circuits 113. The impedance matching circuit 14 is preferably arranged adjacent to the supporting frame 12 for reducing an electrical path between the impedance matching circuit 14 and the signal contacts 1131 of the corresponding signal circuits 113.

As shown in FIG. 1 and FIG. 2, the supporting frame 12 in the present embodiment is integrally formed as one-piece structure, and a cross section of the supporting frame 12 perpendicular to a height direction H (or parallel to the first surface 111) is in a substantially rectangular or square shape, but the present disclosure is not limited thereto. The supporting frame 12 is abutted against and fixed onto the first surface 111 of the transfer plate 11, and the supporting frame 12 in the present embodiment can be fixed onto the transfer plate 11 by using screws (not shown) to pass through the supporting frame 12 and further to fixed to the transfer plate 11. However, in other embodiments of the present disclosure, the connection between supporting frame 12 and the transfer plate 11 can be established through other manners of connection (e.g., an inserted manner, a wedged manner, an adhering manner, an integrally forming manner, or an ultrasonic welding manner).

Moreover, a portion of the first surface 111 abutted against the supporting frame 12 is arranged outside the signal contacts 1131. That is to say, the signal contacts 1131 are arranged in the receiving space S. In the present embodiment, the portion of the first surface 111 abutted against the supporting frame 12 is in a substantially rectangular or square shape, and is arranged around the signal contacts 1131, but the present disclosure is not limited thereto.

As shown in FIG. 1 and FIG. 2, the guiding plate 13 is disposed on the supporting frame 12. In other words, two opposite ends of the supporting frame 12 are respectively abutted against the transfer plate 11 and the guiding plate 13. The guiding plate 13 has a plurality of thru-holes 131. The thru-holes 131 are arranged around a portion of the guiding plate 13 abutted against the supporting frame 12, and are in spatial communication with the receiving space S. Specifically, the receiving space S of the 3D signal transfer structure 1 can be in spatial communication with an outer space just through the thru-holes 131, but the present disclosure is not limited thereto.

Figure 5:
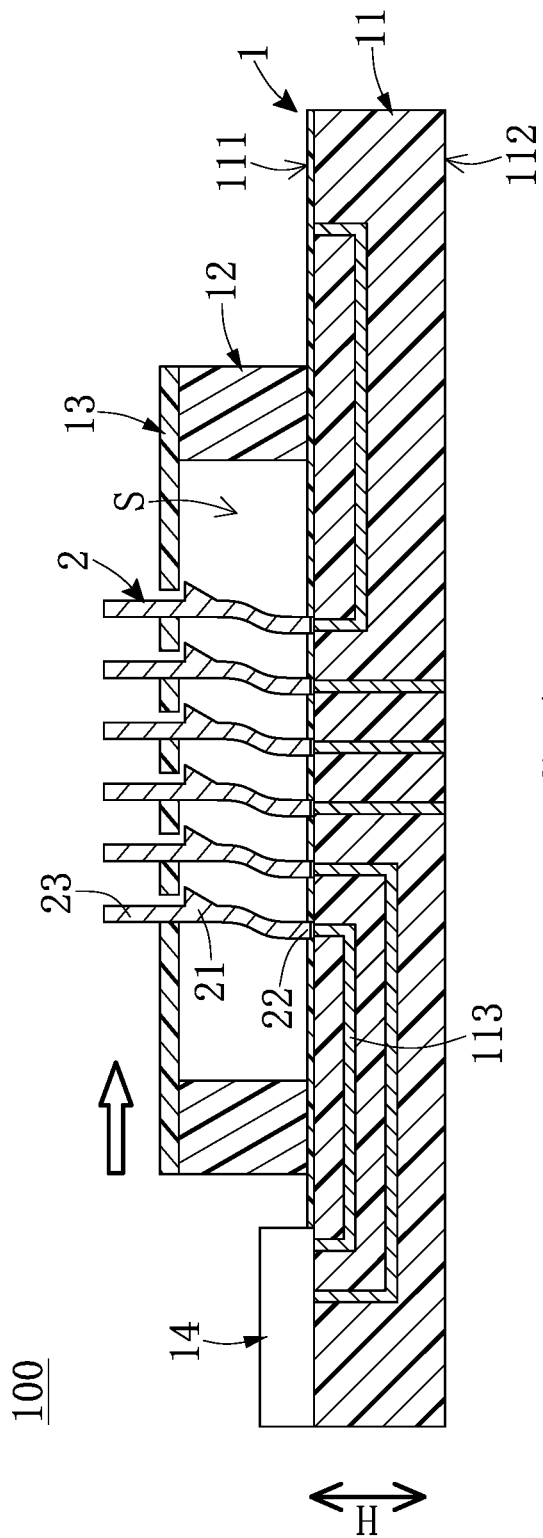
FIG. 5 is a schematic view of a probe card device according to the first embodiment of the present disclosure.

Moreover, the guiding plate 13 in the present embodiment is movable between a probe receiving position (as shown in FIG. 1 or FIG. 2) and a probe retaining position (as shown in FIG. 5) along a staggered direction (parallel to the first surface 111) related to the supporting frame 12. When the guiding plate 13 is at the probe receiving position or the probe retaining position, the guiding plate 13 can be fixed on the supporting frame 12 by screws (not shown) for being maintained at the probe receiving position or the probe retaining position. In addition, in other embodiments of the present disclosure, the guiding plate 13 can be fixed on the supporting frame 12 by other manners (e.g., a wedged manner) for being maintained at the probe receiving position or the probe retaining position.

As shown in FIG. 2 and FIG. 5, each of the conductive probes 2 has an elastic segment 21, a connecting segment 22, and a detecting segment 23, the latter two of which are respectively arranged at two opposite sides of the elastic segment 21. It should be noted that the conductive probe 2 in the present embodiment is an elongated structure that is electrically conductive and structurally flexible, and the conductive probe 2 can be a rectangular probe, a round probe, or a probe in other shapes.

Moreover, the conductive probes 2 respectively pass though the thru-holes 131 of the guiding plate 13, the elastic segment 21 and the connecting segment 22 of each of the conductive probes 2 are arranged in the receiving space S, and the detecting segment 23 of each of the conductive probes 2 is exposed out of the receiving space S. In other words, each of the conductive probes 2 of the probe card device 100 in the present embodiment is configured to expose only one end portion (i.e., the detecting segment 23) thereof from the 3D signal transfer structure 1. Accordingly, any probe card provided with at least one probe exposing its two opposite end portions does not suitable to be regarded as the probe card device 100 of the present embodiment.

Specifically, the connecting segments 22 of the conductive probes 2 are respectively fixed on the signal contacts 1131 of the transfer plate 11, so that the impedance matching circuit 14 can be electrically coupled to at least part of the signal circuits 113 and the corresponding conductive probes 2.

In the present embodiment, the connecting segment 22 of each of the conductive probes 2 is inserted into and fixed onto the recess 114 of the corresponding signal contact 1131, but the present disclosure is not limited thereto. For example, in other embodiments of the present disclosure, the connecting segment 22 of the conductive probe 2 can be formed with a recess, and the transfer plate 11 can be formed with a protrusion arranged on the signal contact 1131, and the recess of the connecting segment 22 can be cooperated with the protrusion of the transfer plate 11 for maintain the electrical and structural connection there-between.

In addition, when the guiding plate 13 is at the probe receiving position (as shown in FIG. 2), the thru-holes 131 of the guiding plate 13 respectively correspond in position to the signal contacts 1131 along the height direction H that is perpendicular to the first surface 111 for allowing the conductive probes 2 (e.g., the connecting segments 22 and elastic segments 21) to respectively pass through the thru-holes 131 and to respectively abut against the signal contacts 1131 by the connecting segments 22. Moreover, when the guiding plate 13 is at the positioning position (as shown in FIG. 5), the elastic segment 21 of each of the conductive probes 2 is compressed (by the guiding plate 13) to be in a curved shape.

Specifically, when the guiding plate 13 is at the probe receiving position (as shown in FIG. 2), the relationship between the thru-holes 131 of the guiding plate 13 and the signal contacts 1131 of the transfer plate 11 in the present embodiment is that projecting regions defined by orthogonally projecting the signal contacts 1131 onto the guiding plate 13 along the height direction H are preferably arranged respectively in the thru-holes 131, but the present disclosure is not limited thereto.

In summary, the 3D signal transfer structure 1 of the probe card device 100 in the present embodiment having only one guiding plate 13 is different from conventional probe cards, thereby effectively reducing cost of the probe card device 100 and providing a new development direction. Moreover, the 3D signal transfer structure 1 of the probe card device 100 can be cooperated with shorter conductive probes 2, so that the probe card device 100 can be used to transmit signals of higher frequency.

Second Embodiment

Figure 7:
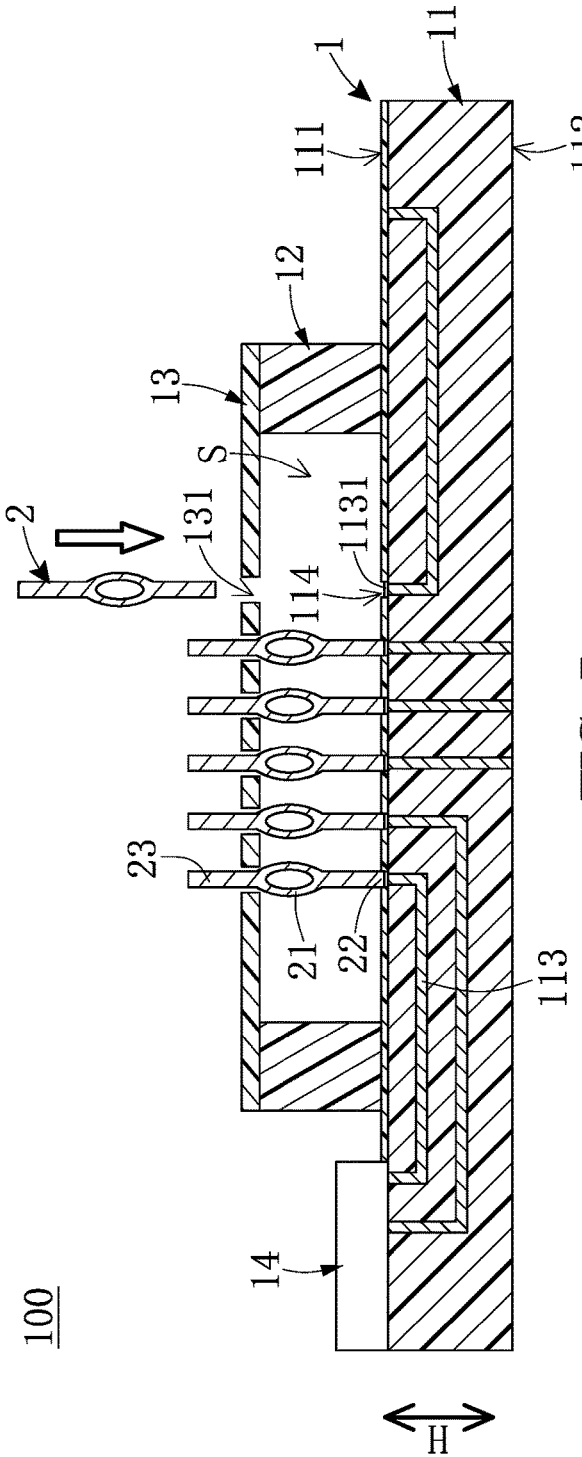
FIG. 7 is a schematic view showing a three-dimensional signal transfer structure to be assembled with probes according to a second embodiment of the present disclosure.
Figure 8:
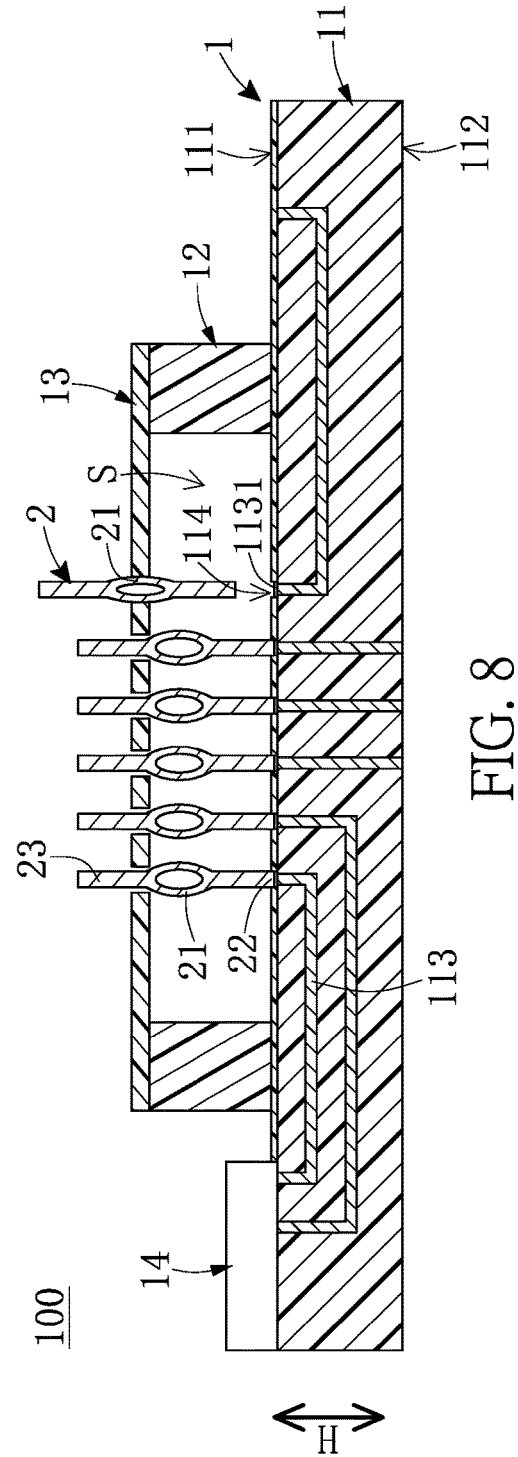
FIG. 8 is a schematic view showing the three-dimensional signal transfer structure to be assembled with the probes according to the second embodiment of the present disclosure.
Figure 9:
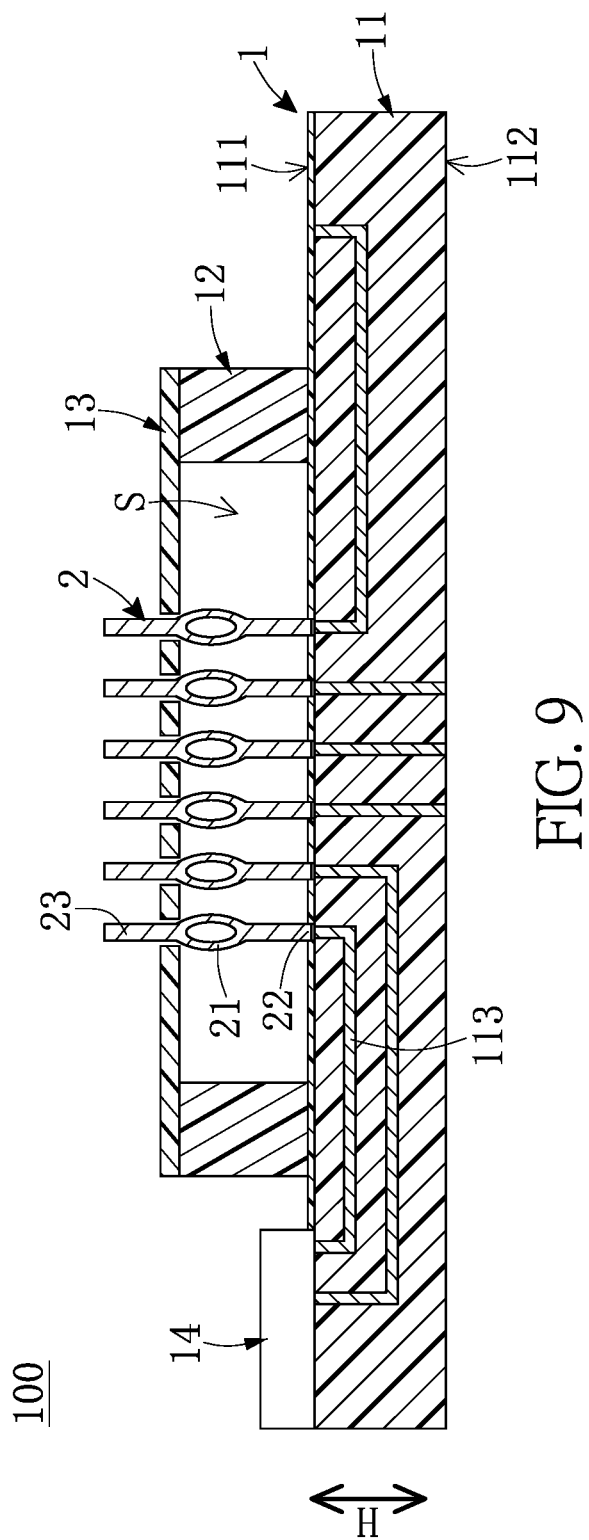
FIG. 9 is a schematic view of a probe card device according to the second embodiment of the present disclosure.

Referring to FIG. 7 to FIG. 9, a second embodiment of the present disclosure provides the probe card device 100 in another configuration. The present embodiment is similar to the first embodiment, and the difference between the embodiments is described as follows.

The guiding plate 13 in the present embodiment is directly fixed on the supporting frame 12, and the guiding plate 13 and the supporting frame 12 have only one relative position and cannot move relative to each other. The thru-holes 131 of the guiding plate 13 respectively correspond in position to the signal contacts 1131 along the height direction H. The elastic segment 21 of each of the conductive probes 2 is configured to pass through the corresponding thru-hole 131 by being elastically deformed, and the elastic segment 21 of each of the conductive probes 2 arranged in the receiving space S is configured to abut against the guiding plate 13 to be at a fixed position.

Specifically, the guiding plate 13 is formed without moving relative to the supporting frame 12 by the structure design of the conductive probes 2, so that the structure and the assembling process of the probe card device 100 can be simplified.

Third Embodiment

Figure 10:
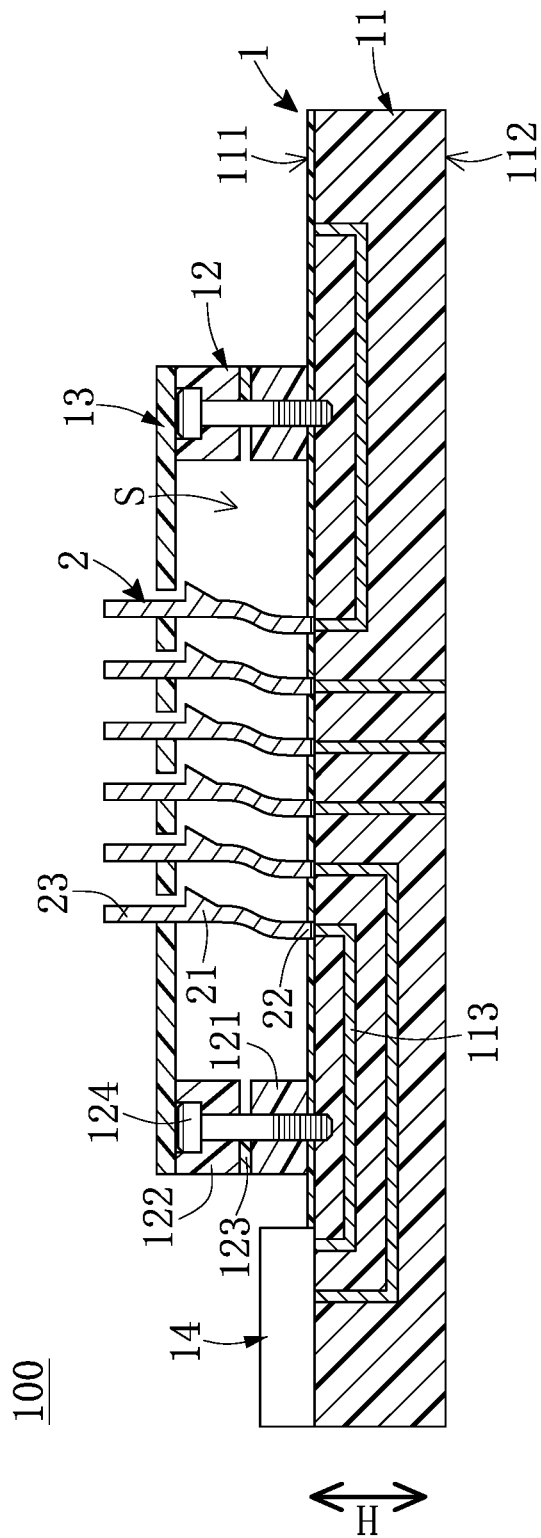
FIG. 10 is a schematic view of a probe card device according to a third embodiment of the present disclosure.
Figure 11:
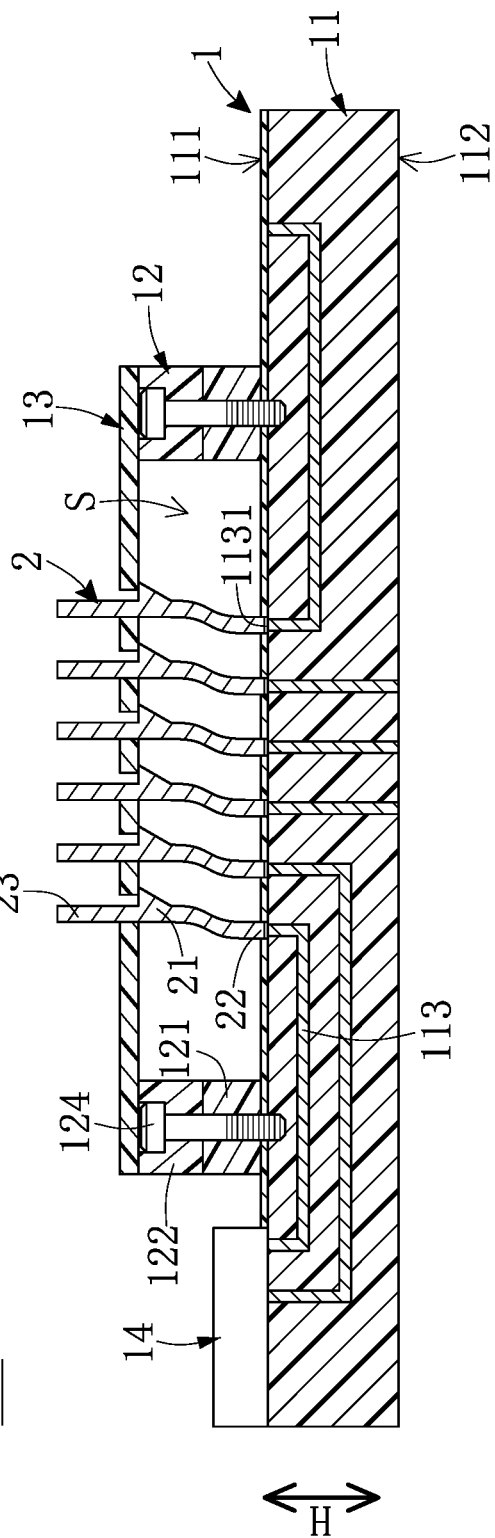
FIG. 11 is a schematic view of the probe card device according to the third embodiment of the present disclosure when an adjusting washer is removed.

Referring to FIG. 10 and FIG. 11, a third embodiment of the present disclosure provides the probe card device 100 in another configuration. The present embodiment is similar to the first embodiment or the second embodiment, and the difference between the embodiments is described as follows.

In the present embodiment, the supporting frame 12 of the present embodiment includes a first frame 121, a second frame 122, an adjusting washer 123, and a plurality of fixing members 124 (e.g., screws). The first frame 121 is abutted against the first surface 111 of the transfer plate 11, the second frame 122 is abutted against the guiding plate 13, and the adjusting washer 123 is sandwiched between the first frame 121 and the second frame 122. Each of the fixing members 124 passes through the first frame 121 and the second frame 122 to be fastened to the transfer plate 11. In addition, the number of the adjusting washer 123 can be changed according to design requirements, and is not limited to one. In other words, the number of the adjusting washer 123 can be more than one.

Moreover, the adjusting washer 123 in the present embodiment is selectively removed for reducing a distance between the first surface 111 of the transfer plate 11 and the guiding plate 13, thereby improving the connection between each of the conductive probes 2 and the corresponding signal contact 1131. In other words, after the probe card device 100 is assembled, the adjusting washer 123 can be removed according to design requirements. The design requirements include: (1) the connection between each of the conductive probes 2 and the corresponding signal contact 1131 needs to be improved; (2) after the detecting segments 23 of the conductive probes 2 are worn down, a portion of each of the conductive probes 2 exposed out of the 3D signal transfer structure 1 can be increased by removing the adjusting washer 123.

In conclusion, the 3D signal transfer structure 1 of the probe card device 100 in the present embodiment having only one guiding plate 13 is different from conventional probe cards, thereby effectively reducing cost of the probe card device 100 and providing a new development direction. Moreover, the 3D signal transfer structure 1 of the probe card device 100 can be cooperated with shorter conductive probes 2, so that the probe card device 100 can be used to transmit signals of higher frequency.

Moreover, since the 3D signal transfer structure 1 of the probe card device 100 in the present embodiment is provided with the adjusting washer 123 sandwiched between the first frame 121 and the second frame 122, a distance between the first surface 111 of the transfer plate 11 and the guiding plate 13 can be reduced by removing the adjusting washer 123, thereby improving the connection between each of the conductive probes 2 and the corresponding signal contact 1131.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A probe card device, comprising:
   a three-dimensional (3D) signal transfer structure including:
   a transfer plate having a first surface and a second surface that is opposite to the first surface, wherein the transfer plate includes a plurality of signal circuits each having a signal contact arranged on the first surface;
   a supporting frame abutted against and fixed onto the first surface of the transfer plate, wherein a portion of the first surface abutted against the supporting frame is arranged outside the signal contacts; and
   a guiding plate having a plurality of thru-holes and disposed on the supporting frame, wherein the guiding plate, the supporting frame, and the transfer plate jointly and surroundingly define a receiving space, and the signal contacts of the transfer plate are arranged in the receiving space; and
   a plurality of conductive probes each having an elastic segment, a detecting segment, and a connecting segment, the latter two of which are respectively arranged at two opposite sides of the elastic segment, wherein the conductive probes respectively pass though the thru-holes of the guiding plate, the elastic segment and the connecting segment of each of the conductive probes are arranged in the receiving space, and the detecting segment of each of the conductive probes is exposed out of the receiving space, and wherein the connecting segments of the conductive probes are respectively fixed on the signal contacts of the transfer plate;
   wherein the supporting frame includes:
   a first frame abutting against the first surface of the transfer plate:
   a second frame abutting against the guiding plate:
   an adjusting washer sandwiched between the first frame and the second frame; and
   a plurality of fixing members each passing through the first frame and the second frame to be fastened to the transfer plate,
   wherein the adjusting washer is selectively removed for reducing a distance between the first surface of the transfer plate and the guiding plate.

2. The probe card device according to claim 1, wherein the guiding plate is movable between a probe receiving position and a probe retaining position related to the supporting frame; when the guiding plate is at the probe receiving position, the thru-holes of the guiding plate respectively correspond in position to the signal contacts along a height direction for allowing the conductive probes to respectively pass through the thru-holes and respectively abut against the signal contacts; when the guiding plate is at the probe retaining position, the elastic segment of each of the conductive probes is compressed to be in a curved shape.

3. The probe card device according to claim 1, wherein the guiding plate is fixed on the supporting frame, the thru-holes of the guiding plate respectively correspond in position to the signal contacts along a height direction, the elastic segment of each of the conductive probes is configured to pass through the corresponding thru-hole by being elastically deformed, and the elastic segment of each of the conductive probes arranged in the receiving space is configured to abut against the guiding plate to be at a fixed position.

4. The probe card device according to claim 1, wherein the transfer plate has a plurality of recesses respectively arranged on the signal contacts in the receiving space, and each of the conductive probe is inserted into and fixed onto the recess of the corresponding signal contact.

5. The probe card device according to claim 1, wherein the transfer plate includes an impedance matching circuit arranged outside the receiving space, and the impedance matching circuit is electrically coupled to at least part of the signal circuits and the corresponding conductive probes.

6. A three-dimensional (3D) signal transfer structure of a probe card device, comprising:

a transfer plate having a first surface and a second surface that is opposite to the first surface, wherein the transfer plate includes a plurality of signal circuits each having a signal contact arranged on the first surface;

a supporting frame abutted against and fixed onto the first surface of the transfer plate, wherein a portion of the first surface abutted against the supporting frame is arranged outside the signal contacts; and a guiding plate having a plurality of thru-holes and disposed on the supporting frame, wherein the guiding plate, the supporting frame, and the transfer plate jointly and surroundingly define a receiving space, and the signal contacts of the transfer plate are arranged in the receiving space;

wherein the supporting frame includes:

a first frame abutting against the first surface of the transfer plate;

a second frame abutting against the guiding plate;

an adjusting washer sandwiched between the first frame and the second frame and the second; and a plurality of fixing members each passing through the first frame and the second frame to be fastened to the transfer plate, wherein the adjusting washer is selectively removed for reducing a distance between the first surface of the transfer plate and the guiding plate.

7. The 3D signal transfer structure according to claim 6, wherein the guiding plate is movable between a probe receiving position and a probe retaining position related to the supporting frame; when the guiding plate is at the probe receiving position, the thru-holes of the guiding plate respectively correspond in position to the signal contacts along a height direction.

8. The 3D signal transfer structure according to claim 6, wherein the transfer plate includes an impedance matching circuit arranged outside the receiving space, and the impedance matching circuit is electrically coupled to at least part of the signal circuits.

* * * * *